US007746167B1

(12) United States Patent
Summerfield

(10) Patent No.: US 7,746,167 B1
(45) Date of Patent: Jun. 29, 2010

(54) METHOD OF AND CIRCUIT FOR ADAPTING PARAMETERS FOR A PREDISTORTION CIRCUIT IN AN INTEGRATED CIRCUIT

(75) Inventor: Stephen Summerfield, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 12/201,706

(22) Filed: Aug. 29, 2008

(51) Int. Cl.
*H03F 1/26* (2006.01)
(52) U.S. Cl. .................................................. 330/149
(58) Field of Classification Search ................. 330/149; 375/296, 297; 455/114.3
See application file for complete search history.

(56) References Cited

U.S. PATENT DOCUMENTS

| 5,867,065 | A | 2/1999 | Leyendecker |
| 6,794,936 | B2 * | 9/2004 | Hsu et al. .................... 330/149 |
| 6,798,843 | B1 | 9/2004 | Wright et al. |
| 6,998,909 | B1 | 2/2006 | Mauer |
| 7,151,405 | B2 | 12/2006 | Nezami |
| 7,269,231 | B2 | 9/2007 | Ding et al. |
| 7,348,844 | B2 * | 3/2008 | Jaenecke ..................... 330/149 |
| 2003/0063686 | A1 * | 4/2003 | Giardina et al. ............. 375/296 |
| 2008/0157819 | A1 | 7/2008 | Bhandari et al. |
| 2008/0157869 | A1 | 7/2008 | Bhandari et al. |
| 2008/0157870 | A1 | 7/2008 | Bhandari et al. |

OTHER PUBLICATIONS

U.S. Appl. No. 12/201,633, filed Aug. 29, 2008, Summerfield.
U.S. Appl. No. 12/201,642, filed Aug. 29, 2008, Summerfield.
U.S. Appl. No. 12/201,702, filed Aug. 29, 2008, Summerfield.
U.S. Appl. No. 12/201,718, filed Aug. 29, 2008, Barnes et al.
Altera Corporation, "Digital Predistortion Reference Design," copyright 1995-2008, pp. 1-2, available at URL: http://www.altera.com/support/refdesigns/sys-sol/wireless/ref-dig-predis.html or from Altera Corporation, 101 Innovation Drive, San Jose, California 95134.
Altera Corporation, "Digital Predistortion," copyright 1995-2008, pp. 1-4, available at URL: http://www.altera.com/end-markets/wireless/advanced-dsp/predistortion/wir-digital-predistortion.html or from Altera Corporation, 101 Innovation Drive, San Jose, California 95134.
Altera Corporation, "Digital Predistortion Reference Design," Application Note AN-314-1.0, Jul. 2003, pp. 1-46, available from Altera Corporation, 101 Innovation Drive, San Jose, California 95134.

(Continued)

*Primary Examiner*—Khanh V Nguyen
(74) *Attorney, Agent, or Firm*—John J. King

(57) ABSTRACT

A method of adapting parameters for a predistortion circuit in an integrated circuit is disclosed. The method comprises receiving, at the predistortion circuit, an input signal to be amplified by a power amplifier; determining a value associated with an information tag for the input signal; applying parameters to the predistortion circuit based upon the determined value; receiving an output of the power amplifier at an input of the integrated circuit; comparing an output of the predistortion circuit with the output of the power amplifier; and generating updated parameters to be applied to the predistortion circuit. An integrated circuit having a circuit for adapting parameters for a predistortion circuit of the integrated circuit is also disclosed.

20 Claims, 7 Drawing Sheets

OTHER PUBLICATIONS

Ding, Lei et al., "A Hammerstein Predistortion Linearization Design Based on the Indirect Learning Architecture," *Proc. of the 2002 IEEE International Conference on Acoustics, Speech & Signal Processing*, May 13, 2002, pp. III-2689-III-2692, vol. 3, IEEE., Piscataway, New Jersey, USA.

Gilabert, Pere L. et al., "Multi-Lookup Table FPGA Implementation of an Adaptive Digital Predistorter for Linearizing RF Power Amplifiers With Memory Effects," *IEEE Transactions on Microwave Theory and Techniques* Feb. 1, 2008, pp. 372-384, vol. 56, No. 2, IEEE, Piscataway, New Jersey, USA.

Kwan, Andrew et al., "Automating the Verification of SDR Base band Signal Processing Algorithms Developed on DSP/FPGA Platform," *Proc. of the 2006 IEEE Workshop on Signal Processing Systems Design and Implementation*, Oct. 1, 2006, pp. 5-9, IEEE, Piscataway, New Jersey, USA.

\* cited by examiner

METHOD OF AND CIRCUIT FOR ADAPTING PARAMETERS FOR A PREDISTORTION CIRCUIT IN AN INTEGRATED CIRCUIT

FIELD OF THE INVENTION

The present invention relates generally to integrated circuits, and in particular, to a method of and circuit for adapting parameters for a predistortion circuit in an integrated circuit.

BACKGROUND OF THE INVENTION

Integrated circuits are an integral part of any electronic device. A variety of integrated circuits are often used together to enable the operation of the electronic device. While integrated circuits are typically designed for a particular application, certain integrated circuits may have configurable logic.

For example, an application specific integrated circuit (ASIC) may have portions comprising configurable logic. Another type of integrated circuit which has configurable logic is a programmable logic device (PLD). A programmable logic device is designed to be user-programmable so that users may implement logic designs of their choices. One type of programmable logic device is a Complex Programmable Logic Device (CPLD). A CPLD includes two or more "function blocks" having a two-level AND/OR structure connected together and to input/output (I/O) resources by an interconnect switch matrix. Another type of programmable logic device is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. For both of these types of programmable logic devices, the functionality of the device is controlled by configuration data bits of a configuration bitstream provided to the device for that purpose.

Integrated circuits may be used in arrangements for transmitting data. Because data transmitted using a power amplifier (PA) may be distorted, a predistortion circuit may be employed. The purpose of predistortion is to negate the non-linear effects of a power amplifier. Predistortion is achieved by applying a non-linear filter to the signal prior to transmission. The predistortion circuit acts on the transmitted data to cancel the distortion in the PA by implementing an inverse model of the amplifier. The predistortion circuit may be a function having a vector of parameters applied to the sequence of transmitted data. However, implementing a predistortion circuit in a device having programmable logic poses a number of problems.

SUMMARY OF THE INVENTION

A method of adapting parameters for a predistortion circuit in an integrated circuit is disclosed. The method comprises receiving, at the predistortion circuit, an input signal to be amplified by a power amplifier; determining a value associated with an information tag for the input signal; applying parameters to the predistortion circuit based upon the determined value; receiving an output of the power amplifier at an input of the integrated circuit; comparing an output of the predistortion circuit with the output of the power amplifier; and generating updated parameters to be applied to the predistortion circuit. The method may further comprise providing a trigger signal to sample capture buffers of the integrated circuit to capture an output of the predistortion circuit associated with the determined value and output of the power amplifier. The method may further comprise receiving the updated parameters from an estimation circuit in response to a switch control signal, wherein receiving updated parameters may comprise receiving a write control signal for storing the parameters in a memory based upon the determined value for the input signal.

According to an alternate embodiment, a method of adapting parameters for a predistortion circuit in an integrated circuit comprises receiving, at the predistortion circuit, an input signal to be amplified by a power amplifier; applying parameters from a first parameter set to the predistortion circuit; determining a power value of the input signal; receiving an output of the power amplifier at an input of the integrated circuit; comparing an output by the predistortion circuit with the output of the power amplifier; and generating parameters for a second parameter set to be applied to the predistortion circuit. The method according to the alternate embodiment may further comprise establishing variation values for the power values associated with the parameter sets, and updating the parameter sets if the determined power value of the input signal is within a range of the power values associated with the parameter sets based upon the variation values. The variation values may be adjusted by increasing the variation value if the determined power value for the input signal is not within a predetermined range of the power values associated with the first parameter set or the second parameter set.

An integrated circuit having a circuit for adapting parameters for a predistortion circuit of the integrated circuit is also disclosed. The circuit for adapting parameters of the integrated circuit comprises a predistortion circuit coupled to receive an input signal; a memory storing the parameters for the predistortion circuit; a power measurement circuit coupled to receive the input signal coupled to the predistortion circuit and generate a power value for the input signal; a control circuit coupled to the memory and the power measurement circuit, the control circuit enabling the selection of parameters for the predistortion circuit; and an estimation circuit coupled to receive the output of the predistortion circuit and an output of a power amplifier, the estimation circuit generating updated parameters to be stored in the memory. The circuit for adapting parameters may further comprise an interval timer coupled to the power measurement circuit, the interval timer enabling the power measurement circuit to periodically measure the power of the input signal. The circuit may also comprise a sample capture buffer coupled to receive the output of the predistortion circuit and the output of a power amplifier.

DETAILED DESCRIPTION

Figure 1:
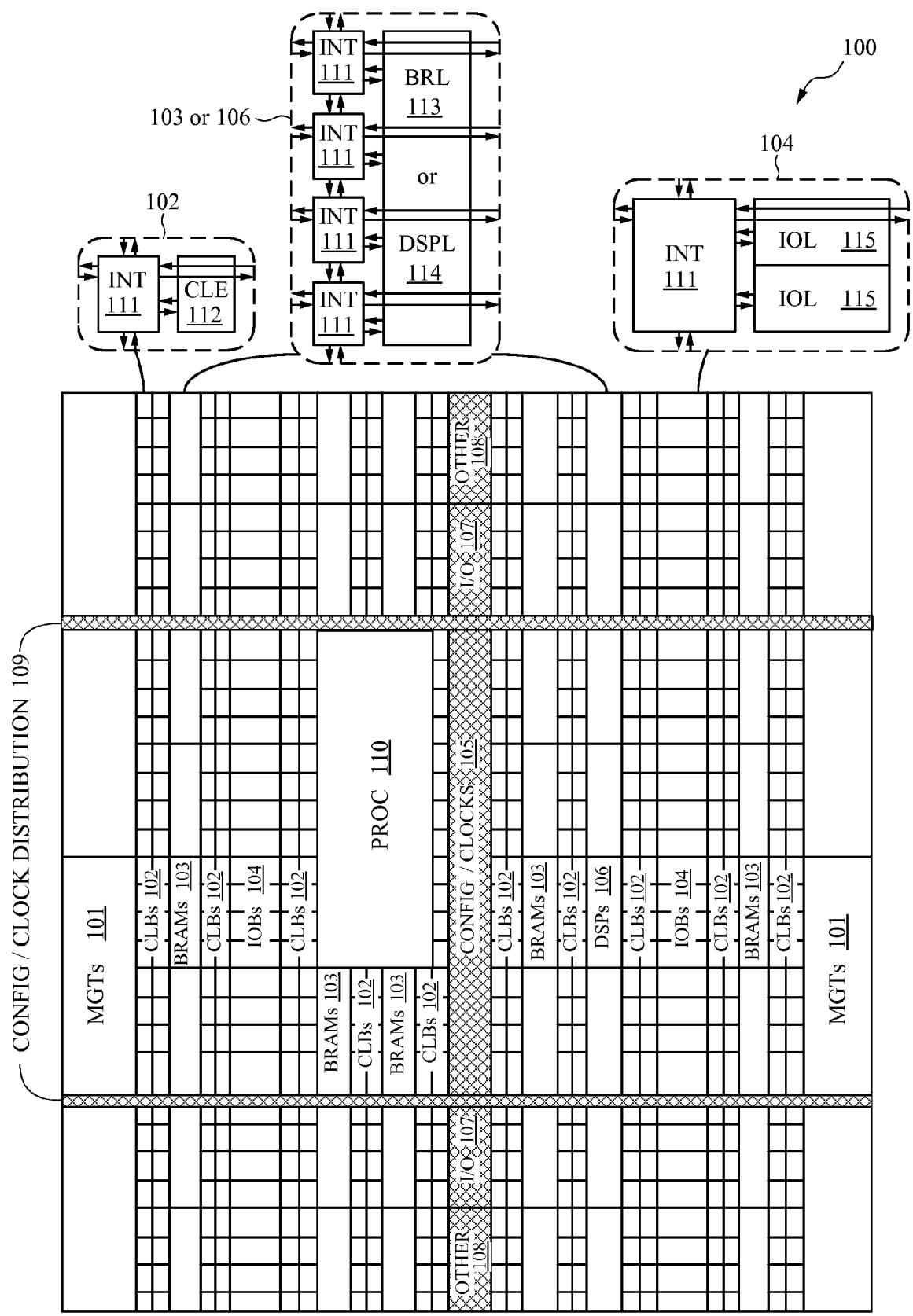
FIG. 1 is a block diagram of a device having configurable logic according to an embodiment the present invention.

Turning first to FIG. 1, a block diagram of a device having configurable logic according to an embodiment the present invention is shown. The device of FIG. 1 comprises an FPGA architecture 100 having a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 may include a configurable logic element (CLE 112) that may be programmed to implement user logic plus a single programmable interconnect element (INT 111). A BRAM 103 may include a BRAM logic element (BRL 113) in addition to one or more programmable interconnect elements. The BRAM comprises dedicated memory separate from the distributed RAM of a configuration logic block. Typically, the number of interconnect elements included in a tile depends on the height of the tile. In the pictured embodiment, a BRAM tile has the same height as four CLBs, but other numbers (e.g., five) may also be used. A DSP tile 106 may include a DSP logic element (DSPL 114) in addition to an appropriate number of programmable interconnect elements. An IOB 104 may include, for example, two instances of an input/output logic element (IOL 115) in addition to one instance of the programmable interconnect element (INT 111). The location of connections of the device is controlled by configuration data bits of a configuration bitstream provided to the device for that purpose. As will be described in more detail below, the programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA. Some FPGAs utilizing the architecture illustrated in FIG. 1 include additional logic blocks that disrupt the regular columnar structure making up a large part of the FPGA. The additional logic blocks may be programmable blocks and/or dedicated logic. For example, the processor block PROC 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic. The circuits and methods of the present invention may be implemented in the PLD of FIG. 1, or in any other suitable device, including any type of integrated circuit having programmable logic.

Figure 2:
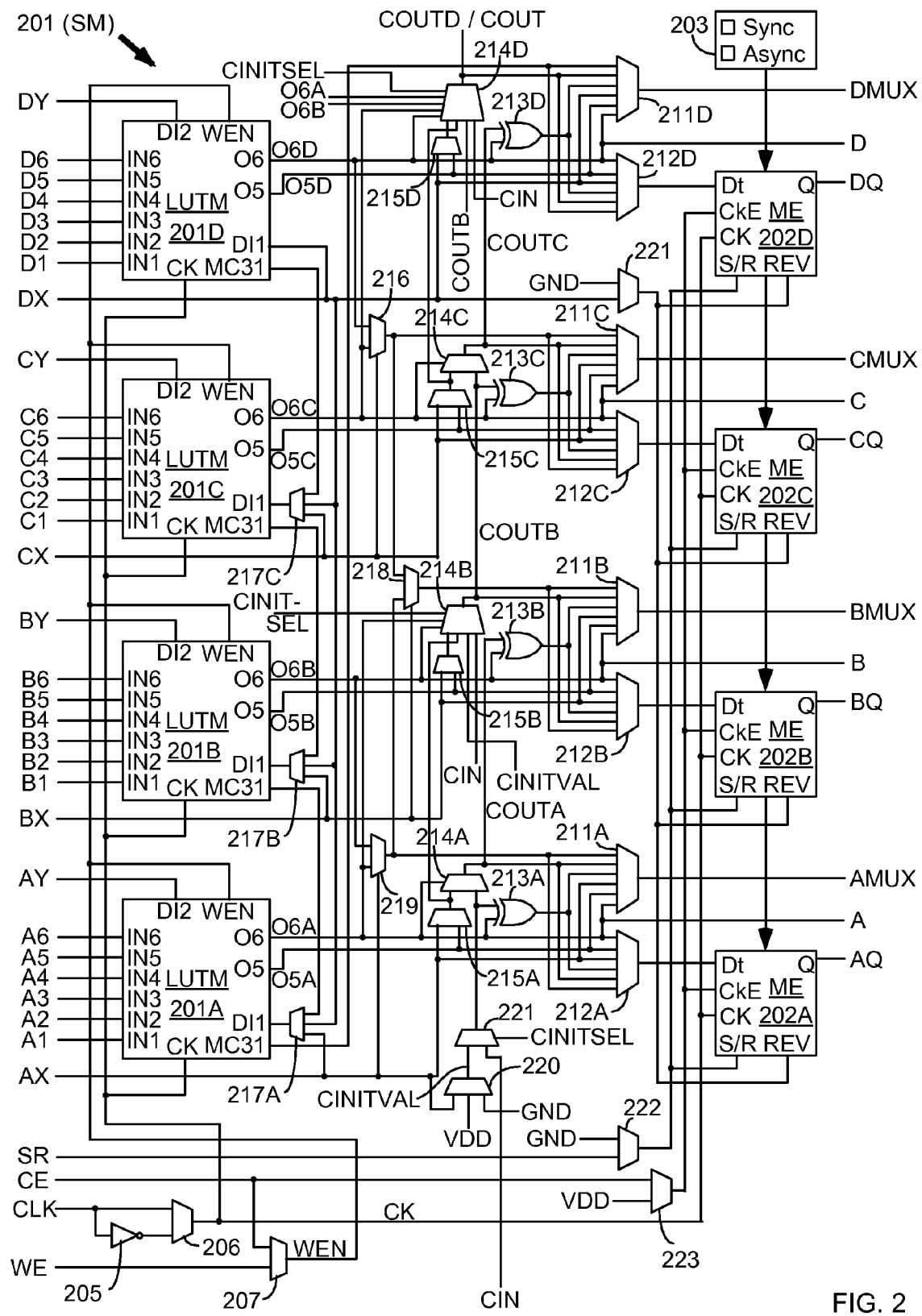
FIG. 2 is a block diagram of a configurable logic element of the device of FIG. 1 according to an embodiment of the present invention.

Turning now to FIG. 2, a block diagram of a configurable logic element of the device of FIG. 1 according to an embodiment of the present invention is shown. In particular, FIG. 2 illustrates in simplified form a configurable logic element of a configuration logic block 102 of FIG. 1. The configurable logic element shown comprises two similar slices, where each slice comprises a pair of function generators. However, the configurable logic element may comprise more slices, such as four slices, for example. Each function generator may function in any of several modes depending upon the configuration data in the configuration memory elements M1-M14. When in RAM mode, input data is supplied by input terminals DI_1 and DI_2 to the data input (DI) terminal of the associated function generator. Each function generator, which may comprise a lookup table, provides an output signal to an associated multiplexer, which selects between the output signal of the function generator and an associated register direct input signal Reg_DI_1 or Reg_DI_2 from the programmable interconnect element. Thus, each function generator may be optionally bypassed. When in a look-up table mode, each function generator implemented as a look-up table has four data input signals IN0-IN3. Slice 1 comprises a function generator implemented as a LUT 202 coupled to a multiplexer 204. In particular, the LUT 202 receives 4 input signals which are decoded to generate an output D1 associated with data stored in the LUT at the address designated by the input signals. The multiplexer 204 is adapted to receive the output of LUT 202 and a registered value of Reg_DI_1. The output of the multiplexer 204 is coupled to a register 206 which generates an output Q1.

A Write Control Circuit 208 is coupled to receive RAM control signals and generate signals to control the LUT 202. In addition to a data input (DI) coupled to receive DI_1 and conventional read and write control signals coupled to a read enable input (R) and a write enable input (W), respectively, the LUT 202 comprises a partial reset input (RST) for receiving a partial reset signal, and an initial state input (IS) for receiving an initial state signal. Such resetting of the memory elements enables resetting the LUT memory cells during a partial reconfiguration of a programmable logic device, including partial reconfiguration of a device during operation. One advantage of resetting LUT memory elements of a device during partial reconfiguration is that it is not necessary to cycle through the required clock cycles to set the correct data after the partial reconfiguration. Similarly, slice 1 comprises a function generator implemented as a LUT 210 coupled to a multiplexer 212. The LUT 210 is adapted to receive input signals IN4-IN7, while the multiplexer 212 is coupled to receive the output D2 of the LUT 210 and the registered input value Reg_DI_2. The output of the multiplexer 212 is coupled to a register 214 which generates an output Q2. The write control circuit 208 also generates a partial reset signal and an initial state signal for selectively resetting or setting one or more of the bits of the LUT 210.

Similarly, slice 2 comprises a function generator implemented as a LUT 222 coupled to a multiplexer 224. The LUT 222 is adapted to receive input signals IN8-IN11, while the multiplexer 224 is coupled to receive the output of the LUT 222 and a registered input value Reg_DI_3. The output of the multiplexer 224 is coupled to a register 226 which generates an output Q3. A Write Control Circuit 228 is coupled to receive RAM control signals and generate signals to control the LUT 222. In particular, input signals IN8-IN11 are decoded to generate an output D3 associated with data stored in the LUT at the address designated by the input signals. The LUT 222 comprises a partial reset input (RST) for receiving a partial reset signal, and an initial state input (IS) for receiving an initial state signal. Similarly, slice 2 comprises a function generator implemented as a LUT 230 coupled to a multiplexer 232. The LUT 230 is adapted to receive input signals IN12-IN15, while the multiplexer 232 is coupled to receive the output D4 of the LUT 230 and a registered input value Reg_DI_4. The output of the multiplexer 232 is coupled to a register 234 which generates an output Q4. The write control circuit 228 also generates a partial reset signal and an initial state signal for selectively resetting or setting one or more of the bits of the LUT 230.

Figure 3:
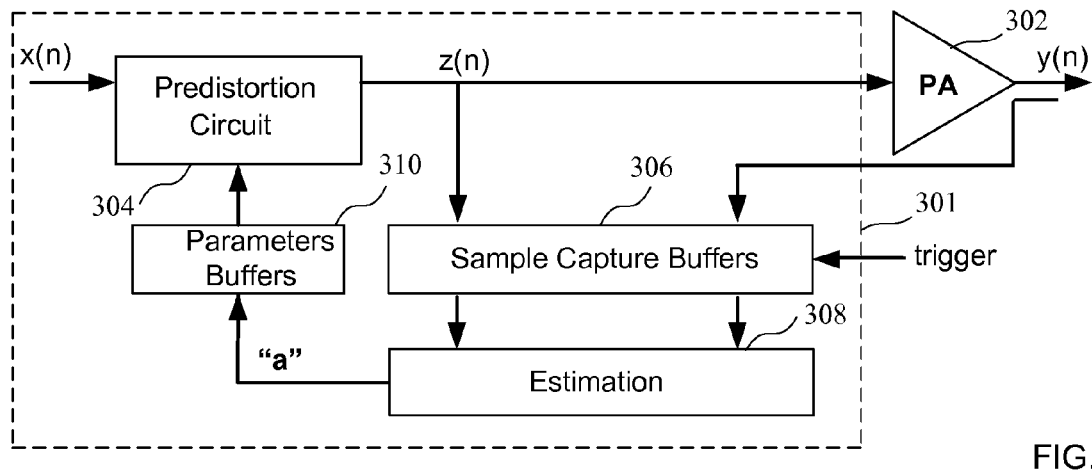
FIG. 3 is a block diagram of an integrated circuit having a circuit for reducing distortion at the output of a power amplifier according to an embodiment of the present invention.

Turning now to FIG. 3, a block diagram of an integrated circuit having a circuit for reducing distortion at the output of a power amplifier according to an embodiment of the present invention is shown. In particular, an integrated circuit 301 is coupled to a power amplifier 302. As will be described in more detail below, analog-to-digital (A/D) and digital-to-analog (D/A) converters may be employed. The integrated circuit comprises a predistortion circuit 304 which is coupled to receive an input signal x(n) and generate an output signal z(n) which comprises a modified version of the input signal and is coupled to the power amplifier. As set forth above, the predistortion circuit modifies the input signal to compensate for distortion in the power amplifier such that the output y(n) of the power amplifier correlates to the input signal. A characterization event for generating parameters to apply to the predistortion circuit begins with a capture of a predetermined number L of samples of data from the input and output of the PA. The samples of the input are taken from the output of the predistortion circuit. Accordingly, the output of the predistortion circuit and the output of the power amplifier are coupled to sample capture buffers 306.

Digital predistortion (DPD) involves performing the operations on a digital signal prior to digital-to-analog conversion. The samples from the output of the PA are typically obtained via some analog circuitry followed by an analog-to-digital converter, as will be described in more detail in reference to FIG. 5. As will further be described in more detail below, a trigger provided to the sample capture buffers enables the storing of the outputs of the predistortion circuit and the power amplifier based upon a detected power value for the input signal. The values stored in the sample capture buffers are provided to an estimation circuit 308. The estimation circuit will generate parameters "a" which will be applied to the predistortion circuit. The parameters may be coefficients of a transfer function, for example, which modify the input signal so that the output of the predistortion circuit offsets the distortion of the power amplifier. The new parameters "a" are stored in a parameters buffer 310 for use by the predistortion circuit. There are number of possible numerical techniques for generating the parameters. Discrete characterization events, where the coefficients are found that best match the PA during some period of L samples duration, may be employed. By way of example, Least Mean Squares estimation over the fixed block of L samples may be used. However, any other method known in the art for generating parameters for a predistortion circuit may be used.

Figure 4:
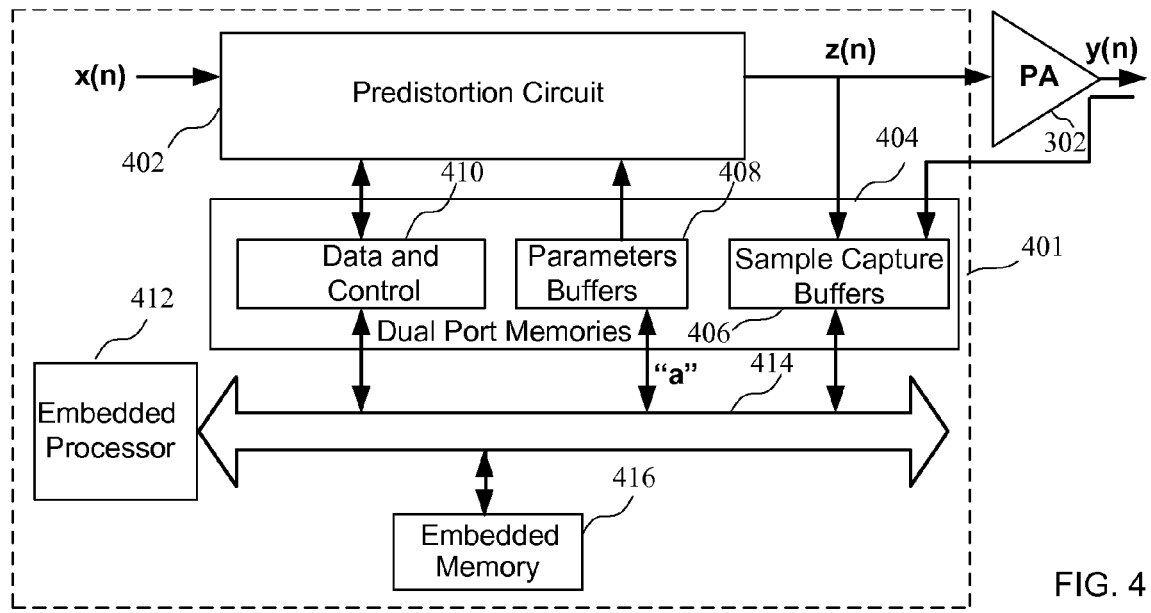
FIG. 4 is a block diagram of an integrated circuit having a circuit for reducing distortion at the output of a power amplifier and an embedded processor according to an embodiment of the present invention.

Turning now to FIG. 4, a block diagram of an integrated circuit having a circuit for reducing distortion at the output of a power amplifier and an embedded processor according to an embodiment of the present invention is shown. The integrated circuit 401 of FIG. 4 may be partitioned into components that process a real-time digitally sampled signal and components that relate to calculating the parameters "a" which may comprise estimation coefficients, for example. The real-time components of FIG. 4 may comprise the predistortion circuit 402 and memory elements 404, but may also include circuits for controlling these components, such as circuits applying a trigger signal to the sample capture buffers. The memory elements 404 may comprise sample capture buffers 406, parameter buffers 408, and data and control buffers 410. Communications between the real-time components are preferably made via dual-port random access memories (DPRAMs), which allow independent access to the memory contents from two sets of inputs and outputs. An embedded processor 412 may be used to provide the estimation function and generate the parameters for the predistortion circuit, which may be provided to the parameter buffers 408 by a bus 414. The main working memory for the processor preferably comprises a dedicated embedded memory 416, as shown, and all the data that is manipulated by the embedded processor may pass through the bus. As will be described in more detail below, multiple buses may be employed, depending upon the data stored in the various memories.

The predistortion circuit 402 may be implemented in configurable logic, such as configurable logic blocks of the circuit of FIG. 1. Similarly, the dual port memories may be implemented as dual port random access memories, and may be implemented in the BRAMs of FIG. 1. Finally, the embedded processor 412 may be the processor 110 of FIG. 1, where the estimation circuit may be implemented in software running on the embedded processor. The embedded processor may be constructed from available hardware resources, or may be implemented as a hardware primitive. By way of example, the embedded processor may be a hardwired processor, such as a PowerPC processor, or may be a processor implemented in configurable logic, such as a Microblaze processor, both of which are available from Xilinx, Inc. of San Jose, Calif. and implemented in Xilinx programmable logic devices.

An estimation sequence executed by the embedded processor will begin by reading and writing the Data and Control DPRAM to establish the trigger for the data capture, with possible conditioning based on the state of the transmitted data. For example, it would be unwise to attempt to generate estimation parameters during a time when there is no data being transmitted. After the L samples are captured in the capture buffers, these samples may then be processed by the estimation software running on the embedded processor to produce the parameters, which are then written into the parameters buffers. After the sample captures are processed, the sample capture buffers are available to the integrated circuit, and particularly the embedded processor for use as further working memory. This availability of memory after generating the parameters helps with overall hardware efficiency. In a practical system, other functions such as measurements of the transmitted signal may also be used by the estimation circuit, as will be described in more detail below in reference to FIG. 6. These real-time functions are included in the predistortion circuit, and the data and control memories are provided for the estimation circuit to enable these functions.

Figure 5:
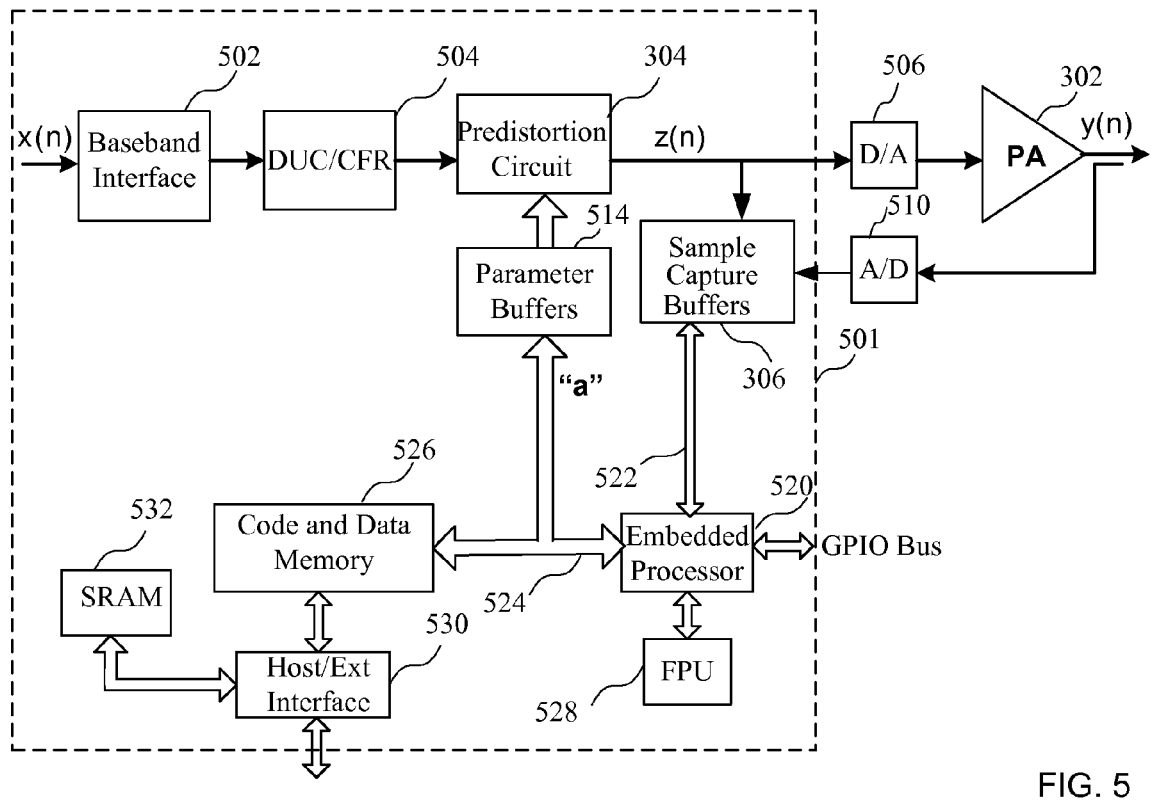
FIG. 5 is a block diagram of an integrated circuit having a circuit for reducing distortion at the output of a power amplifier and an embedded processor according to an alternate embodiment of the present invention.

Turning now to FIG. 5, a block diagram of an integrated circuit having a circuit for reducing distortion at the output of a power amplifier and an embedded processor according to an alternate embodiment of the present invention is shown. In particular, the integrated circuit 501 comprises a baseband interface 502 coupled to receive an input signal, the output of which is coupled to a DUC/CFR circuit 504. The DUC/CFR circuit 504 provides digital up conversion and crest factor reduction. Digital up conversion converts the input signal to the appropriate digital format, while crest factor reduction helps to reduce the peak-to-peak average power ratio, as is well known in the art. The output of the DUC/CFR circuit 504 is applied to the predistortion circuit 304, the output of which is coupled to both a digital-to-analog converter 506 and sample capture buffers 306. The sample capture buffers also receive an output from an analog-to-digital converter 510. As will be described in more detail below, an embedded processor 520 controls the sample capture buffers to ensure that the correct parameters are provided to the predistortion circuit. For example, the embedded processor ensures that the received samples are brought into alignment with the transmitted samples with respect to frequency, time and amplitude. In addition to the amplitude of the signals being aligned, any delay between the two signals will be eliminated to ensure that they are aligned in time. That is, because of the time required to pass through the power amplifier will cause the signals to be out of alignment, it is necessary to adjust the alignment of the signals. Finally, the delay aligned signal may be coupled to a frequency offset correction circuit to ensure that the frequencies of the signal are the same. This processing may be a part of the estimation circuit, and more particularly, a set of functions in the software running on the embedded processor. The processing may be done in real time as they are received, or after they are stored.

The embedded processor 520 may be coupled to a plurality of buses. For example, a first bus 522 may be used to transfer data between the sample capture buffers 512 and the embedded processor 520. A separate bus 524 may be used to couple data between the embedded processor and a code and data memory 526. While a single bus may be used, one benefit of using multiple buses is that the data may be transferred at different data rates. For example, the data from a sample capture buffers may take additional clock cycles to be received because they are received from the programmable logic, while the data from the code and data memory 522 may be accessed directly by the embedded processor. Other circuits, such as a floating point unit (FPU) 528, may be coupled to the embedded processor. Similarly, a host/external interface 530 and a separate SRAM 532 may be used to provide data to the code and data memory 526. The code and data memory 526 may contain any necessary computer code or data required to implement the predistortion circuit using the embedded processor.

Figure 6:
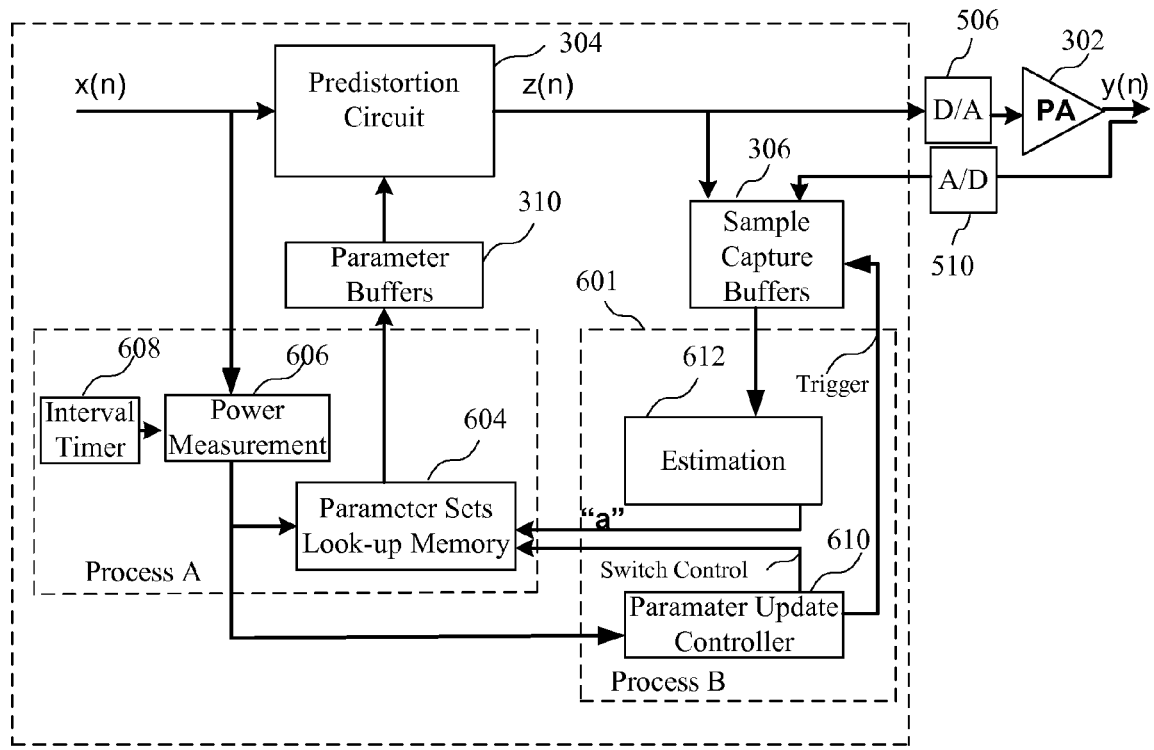
FIG. 6 is a block diagram of an integrated circuit having a circuit for reducing distortion at the output of a power amplifier and circuits for adapting coefficients according to an embodiment of the present invention.

Turning now to FIG. 6, a block diagram of an integrated circuit having circuits for adapting coefficients according to an embodiment of the present invention is shown. One problem faced in implementing a power amplifier in a system is that the average power that is being transmitted may change over time. For example, in a cellular communications system, a variation in average power may result from traffic density or call load. When predistortion parameters are calculated at one average power, the correction of the distortion may not be as beneficial when the transmitted signal changes to a different average power. Particularly, spectral compliance for adjacent channel power may not be achieved at the new power. According to one aspect of the invention, the circuit of FIG. 6 introduces a learning process which tracks the characteristics of the power amplifier, and which operates concurrently with a look-up function that applies different parameters in response to power changes. While the learning process involves the computationally intensive parameter estimation, only the look-up process, which is computationally simple, needs to track the power variations. Thus the computational throughput requirement is reduced, and a more compact integrated digital predistortion arrangement may be achieved.

In particular, the circuit of FIG. 3 has been modified as shown in FIG. 6 to include circuits for implementing a first process, designated as a Process A, for providing a lookup method for parameters which are applied to the predistortion circuit, and a second process, designated as a Process B, for updating the parameters. According to the embodiment of FIG. 6, a parameter sets look-up memory 604 is coupled to receive a power value, such as an average power of the input signal, from a power measurement circuit 606 to determine what values to apply to the predistortion circuit. The power measurement circuit may be controlled by an interval timer 608, for example, which determines the period of operation for Process A. That is, new parameters may be loaded into the parameter buffers on a periodic basis according to an output of the interval timer. The average power may be continuously and repeatedly measured over a time interval that is long enough to be representative of the statistics that determine the spectral character of the signal, such as average power, but short enough to track the call-load. The time interval for determining the average power may be calculated on an order of 10's of milliseconds, for example.

The parameters sets look-up memory contains N parameters sets with information tags, where N is a configuration variable greater than or equal to 1. The information tags may comprise, for example, metrics of the signal, such as an average power or the direction of the power of the signal, metrics of the capture that were used, such as a maximum index or number of peaks, or time, such as interval ticks. In response to the determination of a new power value, which may be generated once per interval, the parameters sets look-up memory updates the parameters in the parameter buffer used by the predistortion circuit. As will be described in more detail below, the parameters sets look-up memory rules may select a parameter set of the plurality of parameter sets according to range criteria. That is, a parameter set may represent a range of power values, and one parameter set may correspond to a given power measurement signal or other metric of the signal.

The parameter sets may be updated according to the Process B controlled by a parameters update controller 610. In particular, an estimation circuit 612 is coupled to receive the outputs of the sample capture buffers and generate the parameters, as set forth above. The parameters update controller is responsible for triggering the estimation process and overwriting parameter sets and information tags according to its defined rules. The parameters update controller rules are preferably also based on the power measurements. The parameters sets look-up memory and parameters update controller rules are driven by the characteristics of a PA when predistorted (i.e. specifically what happens when the signal power changes after the coefficients are calculated).

While Process B is also repetitive, it does not necessarily have a timer. Its period may be determined by the time taken for estimation, thereby improving hardware efficiency of the circuit. Estimation times of the order of seconds by the parameter updates controller are acceptable because the system is fully adaptive at the Process A interval rate once the parameters sets look-up memory is populated. Where a microprocessor is used for the estimation of parameters, the processes enabling predistortion, other than the power measurement which must involve real-time logic, may be implemented in software. Further, Process A and Process B could be concurrent tasks in a real-time operating system environment. Alternatively, with a single-thread program, Process B may be a loop and Process A may be an interrupt service routine, with the interrupt provided by the interval timer. While the circuits for implementing Process A and Process B have been shown in relation to the circuit of FIG. 3 by way of example, these circuits may also be implemented in the embodiments of FIGS. 4 and 5.

Figure 7:
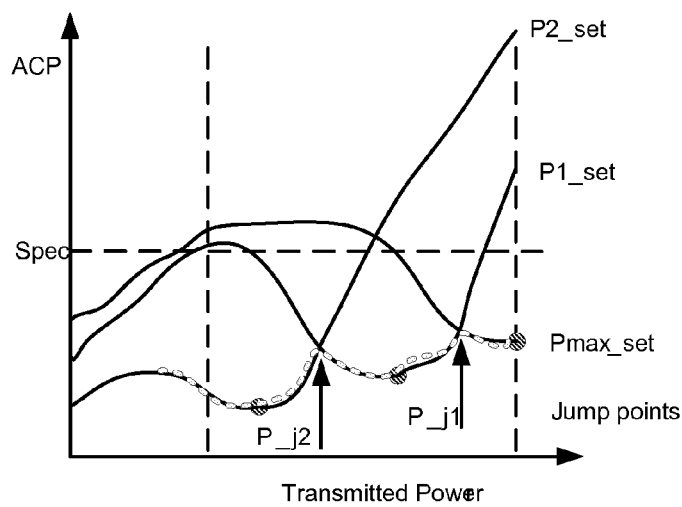
FIG. 7 is a graph showing adjacent channel power as a function of transmitted power for a plurality of parameter sets having coefficients for a predistortion circuit according to an embodiment of the present invention.

Turning now to FIG. 7, a graph shows an example of adjacent channel power as a function of transmitted power for a plurality of parameter sets having coefficients for a predistortion circuit according to an embodiment of the present invention. The characteristics of FIG. 7 show a measure of spectral performance versus output power. A convenient measure of spectral performance is an adjacent channel power (ACP) which is defined for the wireless transmission standard being used. A plot of the characteristics shows ACP versus transmitted power for various powers at which the predistortion parameters were estimated. A line marked "SPEC" is shown to indicate the maximum adjacent channel power to be allowed by a given data transmission specification. As can be seen, at moderate and high powers, the predistortion performance only meets the specification in the vicinity of the power, designated as Pmax, P1 and P2, at which the parameters were estimated. At lower transmission power levels, the predistortion performance is compromised at powers above the power at which the parameters were estimated, but is generally no worse below. It can be seen that if three parameter sets, designated according to the transmitted power Pmax, P1, P2, were to be stored in the parameters sets look-up memory, compliance would be assured if the set that was most appropriate to the transmitted power were to be selected by Process A. By way of example, the parameters sets look-up memory rules select the P2 parameter set for powers below P_j2, the P1 parameter set for powers between P_j2 and P_j1 and the Pmax parameter set for powers above P_j1 as shown by the dotted line. The rules need also to account for an initial period of time before which some or all parameter sets have been obtained. Preferably, an initial parameter set based upon the maximum power value for an input signal could be used.

Ideally, the parameters update controller rules would trigger an estimation function and store the parameters whenever Pmax, P1 and P2 are encountered. While the power is continually varying with some degree of randomness, it is never guaranteed that those powers will be encountered in a reasonable period of time. Accordingly, tolerances or variation values, designated as $\Delta$, are introduced. For example, the Pmax set will be estimated whenever the power is between Pmax-$\Delta$ and Pmax, where $\Delta$ is a configuration variable. A $\Delta$ may be defined separately for each parameter set, such as $\Delta$ max, $\Delta 1$ and $\Delta 2$ for parameter set Pmax, P1 and P2, respectively. The variation values are used to improve the initial learning performance, and are initially set wide. The variation values may also be dynamically changed depending on the state of the parameters sets look-up memory, such as how many sets have been estimated and at which powers. As time evolves and power measurements closer to PMAX, P1 and P2 are encountered, the tolerances may be reduced to a specified minimum. As will be described in more detail below, the tolerance may be reduced to a minimum value after the detected power falls within a range for one of the parameter sets, and that parameter set is updated. It should be noted that ranges defined by the power values and variation values may overlap, in which case multiple parameter sets may be updated.

The tolerances may also be manipulated to accommodate for variations in radio frequency (RF) and PA gain. Variations in RF portions of the circuit for transmitting the signal to the power amplifier and in the power amplifier itself are generally slow variations. These variations may be related to changes in the thermal environment, and may be on a time-scale of minutes, for example. Because the performance of the predistortion circuit may be sensitive to gain, it is desirable that parameters are re-estimated unconditionally within a given time period. This re-estimation may be achieved by increasing the $\Delta$'s with time at a selected rate. Further, some PA's will have a Pmax characteristic similar to the P2 characteristic. That is, the parameters at Pmax are good for all powers. In such a case, the parameters sets look-up memory may only comprise a single parameter set, and the appropriate parameters update controller rule is to re-estimate the parameters whenever the power is greater than the last power at which estimation was performed. The elements of FIGS. 3-6 may be implemented using the device of FIGS. 1 and 2, where the real-time components may be constructed from the hardware resources available within an FPGA which may include logic cells and dedicated arithmetic and memory blocks, and the remaining components may be implemented using the embedded processor as set forth above.

Figure 8:
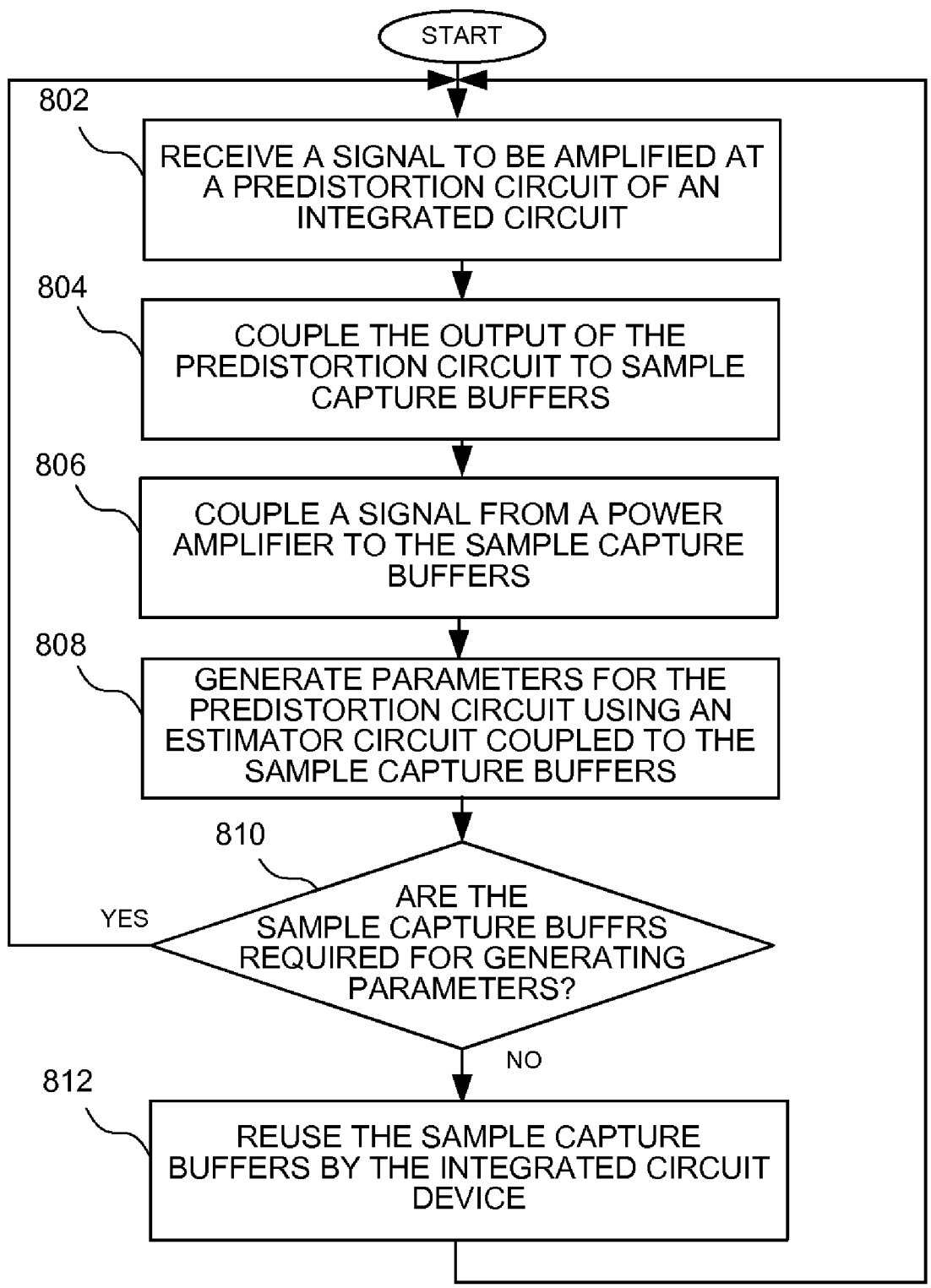
FIG. 8 is a flow chart showing a method of reducing distortion in a power amplifier according to an embodiment of the present invention.

Turning now to FIG. 8, a flow chart shows a method of reducing distortion in a power amplifier according to an embodiment of the present invention. In particular, a signal to be amplified at a predistortion circuit of an integrated circuit is received at a step 802. The output of the predistortion circuit is coupled to sample capture buffers at a step 804, and a signal from a power amplifier is coupled to the sample capture buffers at a step 806. Parameters for the predistortion circuit are generated using an estimator circuit coupled to the sample capture buffers at a step 808. It is then determined if the sample capture buffers are required for generating parameter sets at a step 810. If not, the sample capture buffers are re-used by the integrated circuit device at a step 812. Otherwise, additional parameter sets are generated as necessary. It should be noted that parameter sets may be generated at any time that the measure power falls in to a tolerance band of one of the sets, and the sample capture buffers may be re-used at any time that the buffers are not required. That is, the sample capture buffers are also the working memory of the embedded processor by virtue of the dual port arrangement. In the course of estimation, the processor will need to process the data in the capture buffers, for example to perform filtering or correlation. By employing dual port RAMS, this may be done without having to copy the captured data to some other memory, resulting in saving memory. In the latter phase of estimation, the computations consist of operations performed on a matrix and the sample captures are no longer needed. At that point, the sample capture buffers may be re-used as working memory for the processor.

Figure 9:
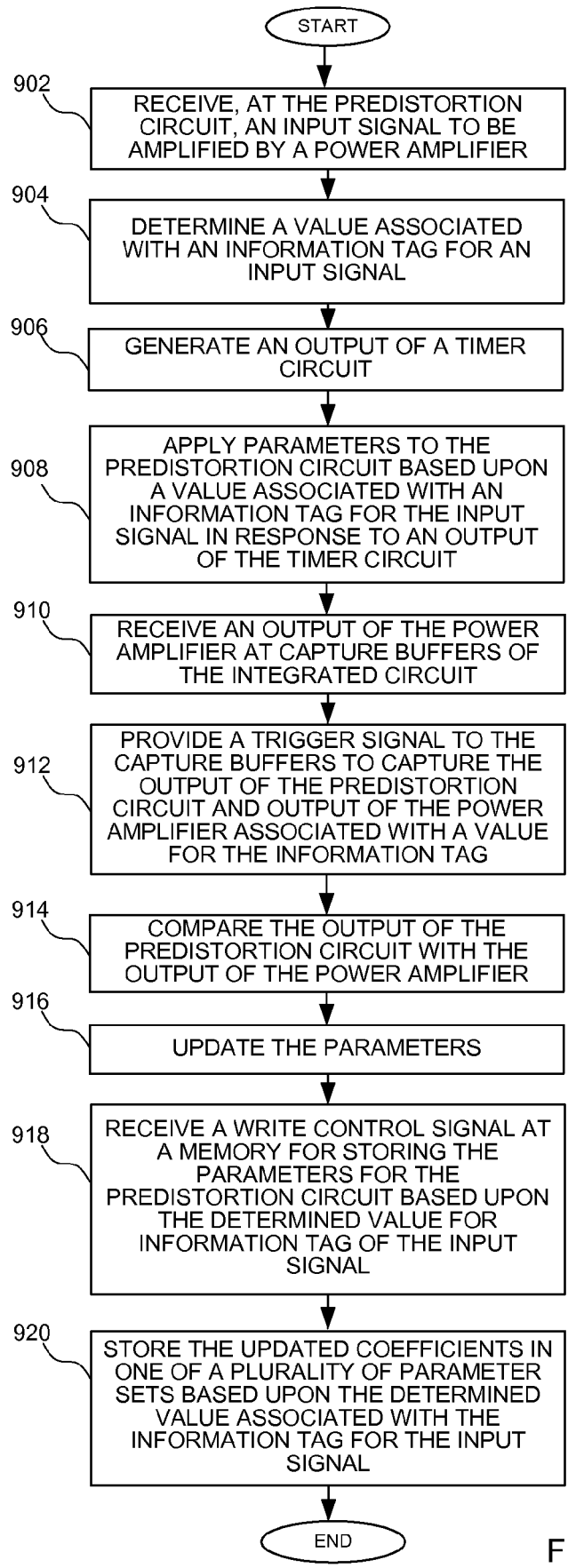
FIG. 9 is a flow chart showing a method of adapting coefficients for a predistortion circuit in an integrated circuit according to an embodiment of the present invention.

Turning now to FIG. 9, a flow chart shows a method of adapting coefficients for a predistortion circuit in an integrated circuit according to an embodiment of the present invention. In particular, an input signal to be amplified by a power amplifier is received at the predistortion circuit at a step 902. A value associated with an information tag for the input signal is determined at a step 904. An output of a timer circuit is generated at a step 906. Coefficients are applied to the predistortion circuit based upon the value associated with the information tag for the input signal in response to an output of the timer circuit at a step 908. The timer circuit may a periodic timer generating a timer signal at regular interval. An output of the power amplifier is received at capture buffers of the integrated circuit at a step 910. A trigger signal is provided to the capture buffers to capture the output of the predistortion circuit and output of the power amplifier associated with a determined value at a step 912. The output of the predistortion circuit is compared with the output of the power amplifier at a step 914. Updated coefficients to be applied to the predistortion circuit are generated at a step 916. A write control signal is received at a memory for storing the updated coefficients for the predistortion circuit based upon the value associated with the information tag for the input signal at a step 918. The updated coefficients are stored in one of a plurality of parameter sets based upon the value associated with the information tag for the input signal at a step 920.

Figure 10:
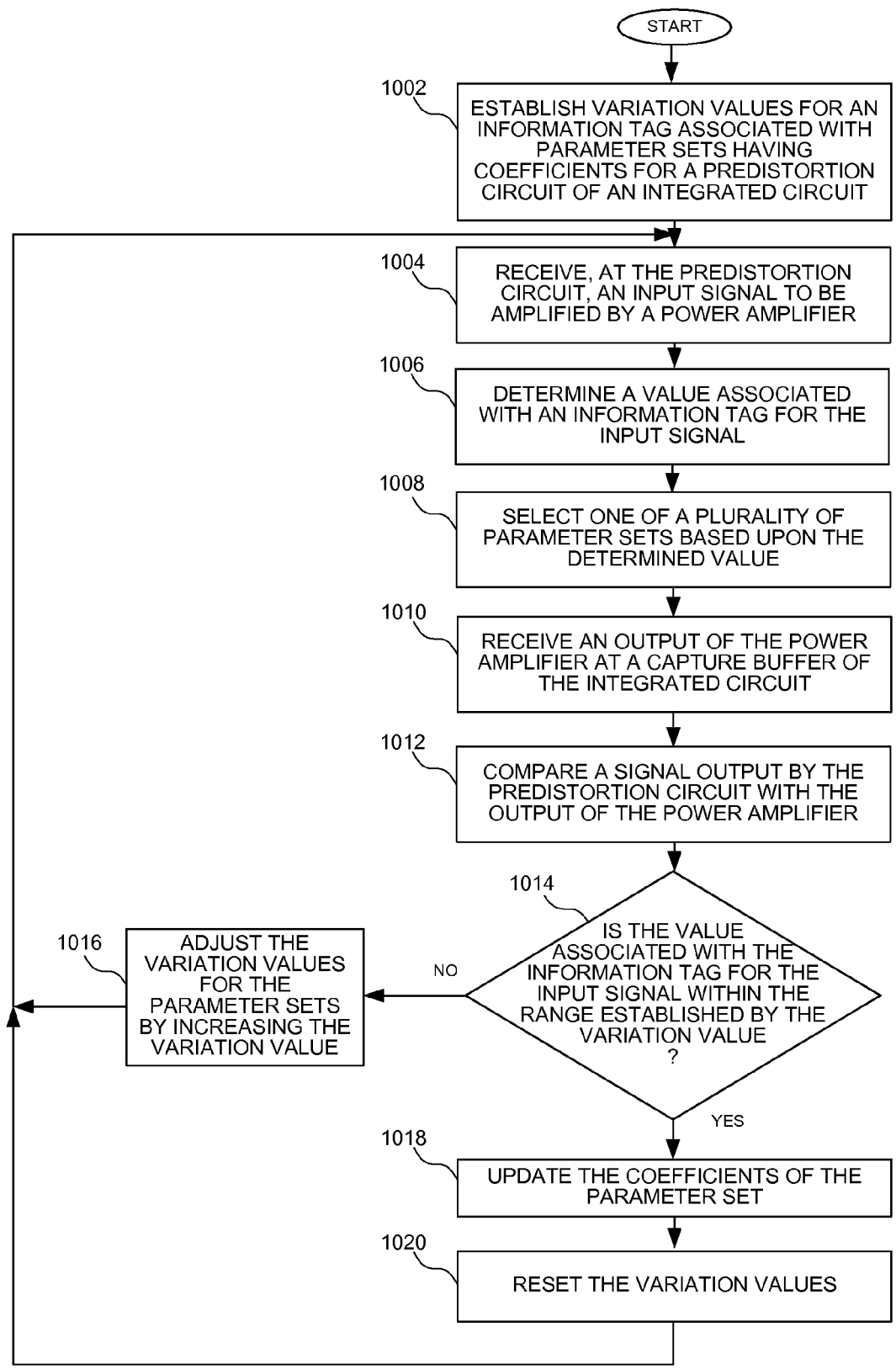
FIG. 10 is a flow chart showing a method of adapting coefficients for a predistortion circuit in an integrated circuit according to an alternate embodiment the present invention.

Turning now to FIG. 10, a flow chart shows a method of adapting coefficients for a predistortion circuit in an integrated circuit according to an alternate embodiment the present invention. In particular, variation values for a value associated with an information tag for the parameter sets having coefficients for a predistortion circuit of an integrated circuit are established at a step 1002. An input signal to be amplified by a power amplifier is received at the predistortion circuit at a step 1004. A value for the information tag for the input signal is determined at a step 1006. One of a plurality of parameter sets is selected based upon the determined value at a step 1008. An output of the power amplifier is received at a capture buffer of the integrated circuit at a step 1010. A signal output by the predistortion circuit is compared with the output of the power amplifier at a step 1012. It is then determined whether the determined value is within the variation value range of the value for the information tag associated with the parameter set at a step 1014. If not, the variation values for the parameter sets are adjusted by increasing the variation values at a step 1016. If the value is within range, the coefficients of the first parameter set are updated at a step 1018. The variation values are the reset at a step 1020. The methods of FIGS. 8-10 may be implemented using any of the circuits of FIGS. 1-7 as described above, or some other suitable circuit.

It can therefore be appreciated that the new and novel circuit for and method of reducing distortion at the output of a power amplifier has been described. It will be appreciated by those skilled in the art that numerous alternatives and equivalents will be seen to exist which incorporate the disclosed invention. As a result, the invention is not to be limited by the foregoing embodiments, but only by the following claims.

What is claimed is:

1. A method of adapting parameters for a predistortion circuit in an integrated circuit, the method comprising:
   receiving, at the predistortion circuit, an input signal to be amplified by a power amplifier;
   determining a value associated with an information tag for the input signal;
   applying parameters to the predistortion circuit based upon the determined value;
   receiving an output of the power amplifier at an input of the integrated circuit;
   comparing an output of the predistortion circuit with the output of the power amplifier; and
   generating updated parameters to be applied to the predistortion circuit.

2. The method of claim 1 further comprising storing the updated parameters for a plurality of parameter sets based upon the determined value.

3. The method of claim 1 wherein applying parameters to the predistortion circuit comprises applying parameters in response to an output of a timer circuit.

4. The method of claim 1 wherein generating updated parameters comprises generating updated parameters to compensate for gain variations of the power amplifier.

5. The method of claim 1 further comprising providing a trigger signal to sample capture buffers of the integrated circuit to capture an output of the predistortion circuit associated with the determined value and the output of the power amplifier.

6. The method of claim 5 further comprising receiving the updated parameters from an estimation circuit in response to a switch control signal.

7. The method of claim 6 wherein receiving updated parameters comprises receiving a write control signal for storing the parameters in a memory based upon the determined value for the input signal.

8. A method of adapting parameters for a predistortion circuit in an integrated circuit, the method comprising:
   receiving, at the predistortion circuit, an input signal to be amplified by a power amplifier;
   applying parameters from a first parameter set to the predistortion circuit;
   determining a power value of the input signal;
   receiving an output of the power amplifier at an input of the integrated circuit;
   comparing an output by the predistortion circuit with the output of the power amplifier; and
   generating parameters for a second parameter set to be applied to the predistortion circuit.

9. The method of claim 8 further comprising establishing a variation value for a power value associated with the first parameter set, and updating the parameters of the first parameter set if the determined power value of the input signal is within a range of the power value associated with the first parameter set based upon the variation value for the power value associated with the first parameter set.

10. The method of claim 9 further comprising establishing a variation value for a power value associated with the second parameter set, and updating the parameters of the second parameter set if the determined power value of the input signal is within a range of the power value associated with the second parameter set based upon the variation value for the power value associated with the second parameter set.

11. The method of claim 10 further comprising applying the parameters for the second parameter set.

12. The method of claim 10 further comprising adjusting the variation values for the first and second parameter sets by increasing the variation value if the determined power value for the input signal is not within a predetermined range of the power values associated with the first parameter set or the second parameter set.

13. The method of claim 12 further comprising resetting the variation values if the determined power value for the input signal is within the predetermined range of the power values associated with the first parameter set or the second parameter set.

14. The method of claim 8 further comprising selecting one of the first parameter set or the second parameter set based upon a determined average power of the input signal.

15. An integrated circuit having a circuit for adapting parameters for a predistortion circuit of the integrated circuit, the circuit for adapting parameters comprising:
   a predistortion circuit coupled to receive an input signal;
   a memory storing the parameters for the predistortion circuit;
   a power measurement circuit coupled to receive the input signal coupled to the predistortion circuit and generate a power value for the input signal;
   a control circuit coupled to the memory and the power measurement circuit, the control circuit enabling the selection of parameters for the predistortion circuit; and
   an estimation circuit coupled to receive the output of the predistortion circuit and an output of a power amplifier, the estimation circuit generating updated parameters to be stored in the memory.

16. The circuit for adapting parameters of claim 15 further comprising an interval timer coupled to the power measurement circuit, the interval timer enabling the power measurement circuit to periodically measure the power of the input signal.

17. The circuit for adapting parameters of claim 15 further comprising a sample capture buffer coupled to receive the output of the predistortion circuit and the output of a power amplifier.

18. The circuit for adapting parameters of claim 17 wherein the control circuit generates a trigger signal for storing the output of the predistortion circuit and the output of the power amplifier in the sample capture buffer.

19. The circuit for adapting parameters of claim 18 wherein the control circuit generates a switch control signal enabling storing updated parameters generated by the estimation circuit in the memory.

20. The circuit for adapting parameters of claim 15 wherein the control circuit comprises processor of a programmable logic device.

* * * * *